United States Patent [19]

Asada et al.

[11] Patent Number: 4,752,442
[45] Date of Patent: Jun. 21, 1988

[54] BONDING WIRE

[75] Inventors: Eiichi Asada, Tokyo; Kazuo Yokoyama, Iruma; Masahiro Yata, Kashiwa; Kenichi Hirano, Sendai, all of Japan

[73] Assignee: Shoei Chemical Inc., Tokyo, Japan

[21] Appl. No.: 74,421

[22] Filed: Jul. 16, 1987

[51] Int. Cl.$^4$ ............................................. C22C 5/02
[52] U.S. Cl. .................................... 420/507; 420/508; 420/511; 428/606; 428/620
[58] Field of Search .................... 420/507, 508, 511; 428/606, 620

[56]  References Cited
U.S. PATENT DOCUMENTS

| | | | |
|---|---|---|---|
| 4,080,485 | 3/1978 | Bonkohara | 428/620 |
| 4,330,329 | 5/1982 | Hayashi et al. | 420/511 |

FOREIGN PATENT DOCUMENTS

| | | | |
|---|---|---|---|
| 2803949 | 8/1979 | Fed. Rep. of Germany | 420/507 |
| 105968 | 9/1978 | Japan | 420/507 |
| 112060 | 9/1978 | Japan | 420/507 |
| 54-23796 | 8/1979 | Japan . | |
| 57-34659 | 7/1982 | Japan . | |
| 58-26662 | 6/1983 | Japan . | |
| 62-22448 | 5/1987 | Japan . | |

*Primary Examiner*—R. Dean
*Assistant Examiner*—Robert L. McDowell
*Attorney, Agent, or Firm*—Flynn, Thiel, Boutell & Tanis

[57] ABSTRACT

A bonding wire for use in semiconductor devices which consists essentially of 0.0003 to 0.01 wt. % of barium and the balance gold, the gold purity of said bonding wire being at least 99.99%. The bonding wire may further contain at least one element selected from the group consisting of 0.0005 to 0.005 wt. % of aluminum, 0.0001 to 0.003 wt. % of calcium, 0.0005 to 0.005 wt. % of silver and 0.0005 to 0.005 wt. % of palladium. The total content of the elements and barium in the bonding wire should not exceed 0.01 wt. % based on the weight of the bonding wire so that the gold purity of the bonding wire is at least 99.99%. The use of the additive elements improve the mechanical strength and wire-bondability, making the bonding wire highly suitable for use in wire bonding of semiconductor elements, especially for high-speed bonding.

2 Claims, No Drawings

BONDING WIRE

BACKGROUND OF THE INVENTION

1. Field of the Invention

The present invention relates to a bonding wire for use in a semiconductor device, particularly in connection between a semiconductor element and an external lead.

2. Prior Art

As a method for electrically connecting an electrode of a semiconductor element and an external lead, there has heretofore been extensively practiced a wire bonding method using a very fine wire of gold, aluminum or the like having a diameter of the order of several microns to several tens of microns. Particularly, a high purity gold wire having a purity of the order of 99.99% has been most commonly employed in such a bonding method because of its excellent corrosion-resistance, extensibility and wire bondability. The wire bonding method using such a gold wire has been usually conducted by a thermocompression bonding process. In the thermocompression bonding process, the gold wire is cut by an electrical means or by melting with a hydrogen flame to form a ball-shaped portion at the tip of the gold wire, the thus produced ball-shaped portion is connected onto an electrode of a semiconductor element by thermocompression and then the other end portion of the gold wire is connected to an external lead by thermocompression. These successive steps are all carried out at high temperature conditions of 200° to 300° C.

In recent years, attempts have been made for high speed and automatic bonding operation. However, when a conventional pure gold wire is used in the high-speed bonding process, it is subject to breaking or softening due to heat in the course of the operation, thereby being rendered unuseless. Therefore, there is a great demand for higher reliable bonding wires improved particularly in the following properties.

(1) They have a high mechanical strength, particularly a sufficiently high tensile strength at high temperatures, so that they are not subject to breaking during the bonding process.

(2) A bonding wire loop connecting an electrode of a semiconductor element and an external lead does not droop by softening due to heat.

(3) They are not subject to deformation by softening during the molding operation with resin.

(4) The shape of a ball formed at the tip of the wire is almost completely spherical and uniform in size and thus scattering in the bonding strength is minimized.

Heretofore, many attempts have been made by adding various elements to the high purity gold wire in order to improve the properties as set forth above. For instance, Japanese patent Publication Nos. 57-34 659 and 58- 26 662 describe that strength can be improved by adding a very small amount of calcium or beryllium. Further, use of other many additives, such as platinum, palladium, silver, titanium, magnesium, etc., have been proposed.

SUMMARY OF THE INVENTION

An object of the present invention is to find an element effective to improve the properties set forth above and thereby provide a bonding wire having a novel composition, particularly a gold bonding wire having a high tensile strength which is suitable for use in high-speed bonding.

The Inventors have conducted various extensive studies on various elements and found that addition of barium to gold has a considerable effect on the properties contemplated by the present invention. Further, it has been found that when barium is added to gold together with one or more additive elements selected from the group consisting of aluminum, calcium, silver and palladium, a cooperative effects can be obtained and the addition amount of barium can be reduced.

According to the present invention, there is provided a bonding wire for use in semiconductor devices which consists essentially of 0.0003 to 0.01 wt.% of barium and the balance gold, the gold purity of said bonding wire being at least 99.99%.

The bonding wire of the present invention specified above may further contain at least one element selected from the group consisting of 0.0005 to 0.005 wt.% of aluminum, 0.0001 to 0.003 wt.% of calcium, 0.0005 to 0.005 wt% of silver and 0.0005 to 0.005 wt.% of palladium. In this case, the total amount of the elements and barium should be not exceed 0.01 wt.% based on the weight of the bonding wire so that the gold purity of the bonding wire is at least 99.99%.

The gold bonding wire of the present invention containing barium, with or without other additive element(s) exhibits extremely superior properties, particularly an increased mechanical strength at room temperature or an elevated temperature and a ball and loop of the wire can be formed in uniform and desired configurations. Thus, the bonding wire is highly reliable for use in wire bonding of semiconductor elements and results in a high yield. Such a desirable combination of the properties renders the wire especially suitable for use in high-speed bonding.

DETAILED DESCRIPTION OF THE PREFERRED EMBODIMENTS

The barium-containing gold wire according to the present invention has a high mechanical strength both at room temperature and high temperatures as compared to a conventional pure gold wire not containing barium and can be successfully bonded to portions to be connected by a high-speed bonder, without causing breakage of the wire, drooping of a bonding wire loop and deformation due to softening. Since the shape of a ball formed at the tip of the gold wire of the invention is spherical and ununiformity in the size is minimized, an extremely high reliability can be achieved. Further, in the manufacturing process of the wire, breaking of the wire during the drawing operation can be minimized due to the high strength of the wire and a good processability is obtained. Additionally, when one or more additives selected from the elements specified hereinbefore are, in addition to barium, contained in the gold bonding wire, the same advantageous properties can be obtained with a reduced amount of barium. Particularly, when barium is added in combination with aluminum or calcium, the total amount of the additives as impurities is substantially reduced due to the synergistic effect of barium and aluminum or calcium.

According to the present invention, the content of barium contained in the bonding wire should be in the range of 0.0003 to 0.01 wt.%. When the content of barium is less than 0.0003 wt.%, the foregoing advantages can be hardly obtained. On the other hand, since a content exceeding 0.01 wt.% leads to an unfavorable increase in resistivity and make it impossible to form a ball in a precisely spherical shape, such an excess content is undesirable. When barium is added with the other additive elements, the total amount of barium and the additive elements should be controlled so as not to exceed the upper limit of 0.01 wt.%. When the content of aluminum exceeds 0.005 wt.%, it is impossible to form a ball in a spherical shape at the tip of the wire and further the drawing properties are deteriorated. When the amounts of calcium, silver and palladium exceed the respective upper limits, i.e., 0.003 wt.%, 0.005 wt.% and 0.005 wt.%, drawing properties are detrimentally affected and thus such excess amounts are unfavorable.

Further, it is essential from the view point of reliability that the gold bonding wire of the present invention have eventually a gold purity of at least of 99.99%. In other words, the content of gold in the bonding wire should be at least 99.99 wt.%. In order to ensure the desired qualities in the resulting gold bonding wire, it is preferred that gold used as a starting material is refined to a degree of at least 99.999% purity and barium and, if necessary, further additive elements are added to such a highly purified gold.

The bonding wire of the present invention may be prepared by any method heretofore known. For example, barium in a predetermined amount is added to gold, with or without the further additive element or elements, and then formed into a wire with a diameter of several microns to several tens of microns by a sequence of steps of melting, casting, forging or rolling, and drawing.

The present invention will be described more specifically by referring to the following Examples and Comparative Example.

EXAMPLE 1

To gold of at least 99.999% purity was added barium in an amount of 0.0005 wt.% based on the total amount of gold and barium and the resulting mixture was melted. The melted material was cast, forged and drawn into a bonding wire of a diameter of 25 μm.

The wire thus obtained was heat-treated so that the breaking elongation at room temperature is 4% and, then, its tensile strength was measured both at room temperature and after standing the wire at 250 ° C. for a period of 25 seconds. The measurement results are given together with the elongation in Table 1.

EXAMPLES 2-4

Further bonding wires were prepared in the same procedure as described in Example 1 except that barium was added in amounts of 0.002 wt.%, 0.006 wt.% and 0.001 wt.%, respectively, based on the total amount of gold and barium. Tensile strength was measured at room temperature and a high temperature (250° C.) for those bonding wires in the same manner as described in Example 1 and the results are given in Table 1, together with the elongations.

EXAMPLES 5-13

Bonding wires were prepared in the same procedure as described in Example 1 except that barium and further additive element or elements were added in the amounts shown in Table 1 and were subjected to the same measurements of tensile strength as in Example 1. The results are shown with the elongations in Table 1. The addition amounts are all shown based on the total amount of gold and the additive elements.

In addition to the foregoing high tensile strength, the bonding wires obtained in the Examples all showed extremely good results in the formation of a spherical ball and the shape of a loop formed during the bonding process.

COMPARATIVE EXAMPLES

For the purpose of comparison, the same measurements were conducted for a conventional wire of pure gold of at least 99.99% purity, 25 μm in a diameter, not containing barium and the results are given in Table 1.

The gold purities of the bonding wires are also indicated in Table 1.

TABLE 1

| | Gold Purity (%) | Amount of Additives (wt. %) | | | | | Room Temperature | | 250° C. | |
|---|---|---|---|---|---|---|---|---|---|---|
| | | Barium | Aluminum | Calcium | Silver | Palladium | Tensile Strength (g) | Elongation (%) | Tensile Strength (g) | Elongation (%) |
| Example | | | | | | | | | | |
| 1 | ≧99.99 | 0.0005 | — | — | — | — | 6.5 | 4.0 | 4.0 | 3.0 |
| 2 | ≧99.99 | 0.002 | — | — | — | — | 8.0 | 4.0 | 5.0 | 2.8 |
| 3 | ≧99.99 | 0.006 | — | — | — | — | 10.0 | 4.0 | 8.0 | 2.4 |
| 4 | ≧99.99 | 0.01 | — | — | — | — | 11.0 | 4.0 | 8.2 | 2.0 |
| 5 | ≧99.99 | 0.005 | 0.002 | — | — | — | 10.7 | 4.0 | 8.0 | 2.4 |
| 6 | ≧99.99 | 0.005 | — | 0.0003 | — | — | 10.0 | 4.0 | 7.5 | 3.2 |
| 7 | ≧99.99 | 0.005 | — | — | 0.002 | — | 8.0 | 4.0 | 6.0 | 2.0 |
| 8 | ≧99.99 | 0.005 | — | — | — | 0.002 | 8.2 | 4.0 | 6.5 | 2.5 |
| 9 | ≧99.99 | 0.003 | 0.002 | 0.0003 | — | — | 11.5 | 4.0 | 11.5 | 2.9 |
| 10 | ≧99.99 | 0.003 | 0.0009 | 0.0003 | — | — | 11.2 | 4.0 | 8.7 | 3.4 |
| 11 | ≧99.99 | 0.002 | 0.0009 | 0.0003 | — | — | 11.0 | 4.0 | 8.2 | 3.7 |
| 12 | ≧99.99 | 0.002 | — | 0.001 | — | — | 11.8 | 4.0 | 11.0 | 3.2 |
| 13 | ≧99.99 | 0.0015 | 0.0009 | 0.0003 | — | — | 10.8 | 4.0 | 7.9 | 3.4 |
| Comparative Example | | | | | | | | | | |
| 1 | ≧99.99 | — | — | — | — | — | 6.0 | 4.0 | 3.0 | 6.0 |

From Table 1, it becomes apparent that the bonding wire of the present invention is greatly improved in the mechanical strength while ensuring desired elongation levels both at room temperature and an elevated temperature.

What is claimed is:

1. A bonding wire for use in a semiconductor device which consists essentially of 0.0003 to 0.01 wt.% of barium and the balance gold, the gold purity of said bonding wire being at least 99.99%.

2. A bonding wire as claimed in claim 1, in which said bonding wire further contains at least one element selected from the group consisting of 0.0005 to 0.005 wt.% of aluminum, 0.0001 to 0.003 wt.% of calcium, 0.0005 to 0.005 wt% of silver and 0.0005 to 0.005 wt.% of palladium, the total content of said elements and barium in said bonding wire being a maximum of 0.01 wt.%.

* * * * *